(12) United States Patent
Richard

(10) Patent No.: US 8,015,476 B2
(45) Date of Patent: *Sep. 6, 2011

(54) CRC SYNDROME GENERATION FOR MULTIPLE DATA INPUT WIDTHS

(75) Inventor: Elizabeth Anne Richard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1084 days.

This patent is subject to a terminal disclaimer.

(21) Appl. No.: 11/778,860

(22) Filed: Jul. 17, 2007

(65) Prior Publication Data

US 2009/0024907 A1 Jan. 22, 2009

(51) Int. Cl.
*H03M 13/03* (2006.01)
(52) U.S. Cl. .......... 714/793; 714/796; 714/758
(58) Field of Classification Search ........... 714/796, 714/757, 758, 785, 776, 820
See application file for complete search history.

(56) References Cited

U.S. PATENT DOCUMENTS

| | | | | |
|---|---|---|---|---|
| 5,935,268 A | * | 8/1999 | Weaver | 714/758 |
| 6,223,320 B1 | * | 4/2001 | Dubey et al. | 714/757 |
| 6,434,720 B1 | * | 8/2002 | Meyer | 714/820 |
| 7,082,563 B2 | * | 7/2006 | Gemelli et al. | 714/758 |

* cited by examiner

*Primary Examiner* — Fritz Alphonse
(74) *Attorney, Agent, or Firm* — Dawn V Stephens; W. James Brady; Frederick J. Telecky, Jr.

(57) ABSTRACT

A sequence of cyclic redundancy check syndromes can be produced based on a received sequence of sets of parallel data wherein different ones of the sets can have respectively different parallel data widths. Some of the syndromes are produced based on respectively corresponding ones of the sets that each have a first parallel data width. At least one of the syndromes is produced based on a corresponding at least one of the sets that has a second parallel data width that is less than the first parallel data width. The last syndrome of the sequence of syndromes corresponds to all of the data in the received sequence of sets.

20 Claims, 3 Drawing Sheets

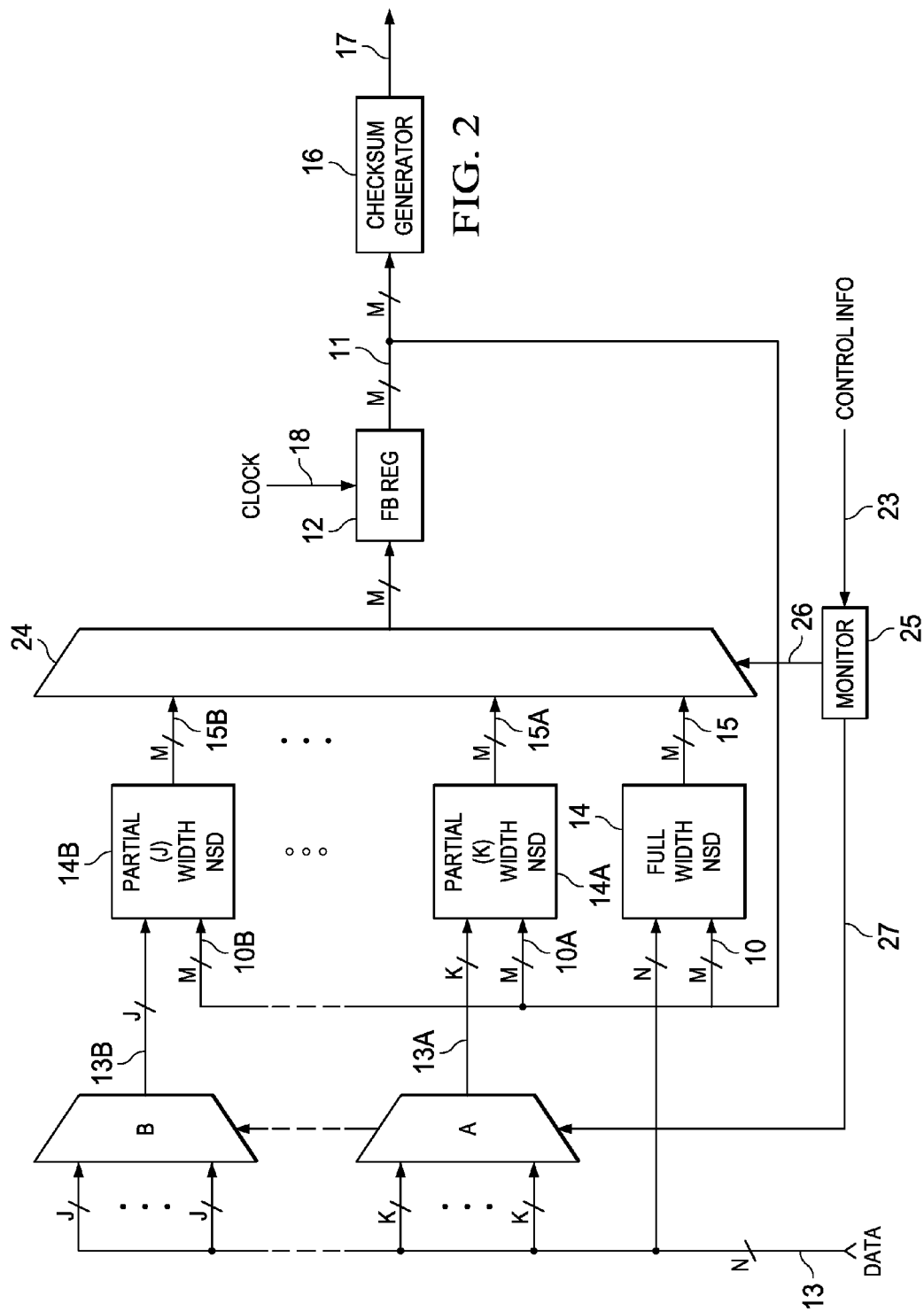

ived parallel sets of data within the block cannot be guaranteed to comply with the NSD's required data width. The parallel sets of data in the block between the starting and ending sets will of course comply with the required data width. The aforementioned width misalignment between the format of the received data block and the input data width of the NSD prevents the NSD from properly determining the final syndrome for the received data block. The input data width (e.g., at data input 13 of NSD 14) could be set to the narrowest data width that the misaligned data block is expected to present, but this effectively limits the width of the input data stream, and can thus impose a corresponding limit on data throughput in the CRC processing.

CRC SYNDROME GENERATION FOR MULTIPLE DATA INPUT WIDTHS

FIELD OF THE INVENTION

The invention relates generally to cyclic redundancy check (CRC) processing and, more particularly, to syndrome generation in CRC processing.

BACKGROUND OF THE INVENTION

Conventional CRC operation involves processing a data stream against a known CRC polynomial that yields a result that is nearly unique to that data stream. Modifications of bits in the data stream cause different CRC results. Consequently, if data is corrupted in delivery of the stream, the calculated CRC results will not match the expected CRC results. The width and values in the polynomial determine the strength (uniqueness) of the CRC. A next-state decoder (NSD) implements the calculation of the CRC polynomial against the incoming data. The CRC is widely applicable in many situations, for example, in endeavors that transmit, receive, store, retrieve, transfer, or otherwise communicate electronically represented digital information.

According to conventional CRC operation, and as shown in FIG. 1, a syndrome 11 contained in a feedback register (FB REG) 12 is fed back to the syndrome input 10 of the NSD 14. The NSD 14 also receives the current piece of incoming data 13. The resulting output 15 of the NSD 14 is registered into the feedback register 12, and thus becomes the next syndrome at 11 for the NSD 14 to use with the next set of incoming data at 13. The initial state of the feedback register 12 (i.e., the initial syndrome value 11) is set to an appropriate value for the CRC polynomial that has been selected for use. A checksum generator 16 performs a predetermined operation on the final syndrome value 11 contained in the feedback register 12 after all of the incoming data 13 has been processed. The checksum generator 16 produces a CRC checksum value 17. The checksum value determined by the checksum generator 16 could be associated with (e.g., concatenated with, appended to, etc.) the data 13 for transmission, transfer, storage, etc., together with, the data. An example would be a transmit packet having a checksum field associated with, its data (payload) portion. The checksum value determined by the checksum generator 16 could be compared to a further checksum value that has been received, retrieved, etc., together with the data 13. An example would be a received packet whose checksum field contains the further checksum value and whose data (payload) portion contains the data 13. Comparison of the further checksum value to the checksum value determined by the checksum, generator 16 provides a basis for evaluating the validity of the received data 13.

The operation, performed by any given NSD (such as NSD 14) conventionally requires a single specific input data width. For example, the NSD 14 is specifically designed to operate on the parallel data width (e.g., bus width) supported by the data input 13. However, if a data block, (e.g., the data payload portion of a packet) received at input 13 is naturally aligned on boundaries that differ from the data width required by the NSD 14, then at least one of the first-received and last-rece It is therefore desirable to provide a solution to the above-described problems of width misalignment between the format of the input data block and the input data width of the NSD.

BRIEF DESCRIPTION OF THE DRAWINGS

FIG. 2 diagrammatically illustrates the structure and operation of a CRC apparatus according to exemplary embodiments of the invention.

DETAILED DESCRIPTION

Figure 1:
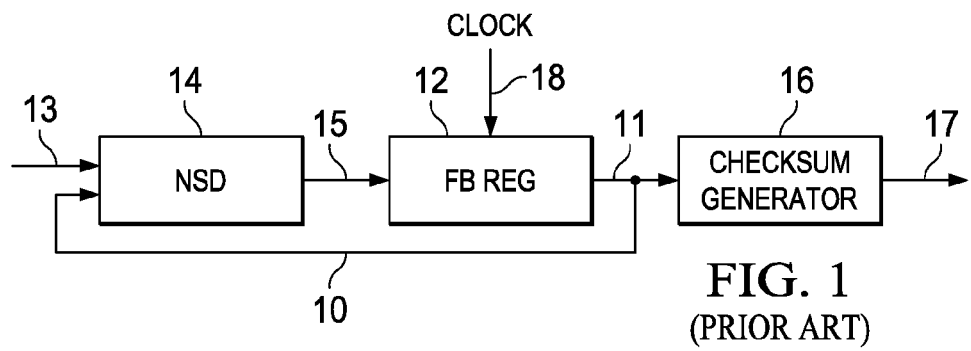
FIG. 1 diagrammatically illustrates the structure and operation of a CRC apparatus according to the prior art.

FIG. 2 diagrammatically illustrates the structure and operation of a CRC apparatus according to exemplary embodiments of the invention. FIG. 2 illustrates an NSD portion capable of handling multiple data widths received at data input 13. In various embodiments, the NSD portion includes a full width NSD 14 (see also FIG. 1), one or more partial width NSDs (such as shown at 14A and 14B), and a selector 24 having an input coupled to the syndrome output 15 of the full width NSD 14, and also having at least one further input coupled to the syndrome output (e.g., 15A, 15B) of one or more partial width NSDs. The selector 24 has an output coupled to the input of a feedback register 12 (see also FIG. 1). The full width NSD 14 is configured to produce M bit syndromes based on data associated with the full parallel width N of the data input 13. Any given partial width NSD is configured to produce M-bit syndromes based on data associated with a portion of the full parallel width N of the data input 13.

In the example of FIG. 2, a partial width NSD 14A is coupled at 13A to receive from data input 13 (via a selector A) a currently valid K-bit portion of the full N-bit width (K<N), and a partial width NSD 14B is coupled to receive from data input 13 (via a selector B) a currently valid J-bit portion of the full N-bit width (J<N, and J≠K). The partial width NSD 14A operates on its K-bit input to produce M-bit syndromes at 15A. The partial width NSD 14B operates on its J-bit input to produce M-bit syndromes at 15B. The selector 24 selects one of the full and partial width NSDs to provide its M-bit syndrome to a feedback path that includes the feedback register 12. The feedback path couples the output of selector 24 to respective syndrome inputs 10, 10A, and 10B of the NSDs 14, 14A, and 14B. The selector A selects the currently valid K-bit subset of the foil input data width 13. The currently valid K-bit subset can occupy different portions of the input data width 13 at different points in time. The selector B selects the currently valid J-bit subset of the full input data width 13. The currently valid J-bit subset can occupy different portions of the input data width 13 at different points in time.

In some embodiments, the number of partial width NSDs employed is based on the number of possible valid data widths that can occur at the data input 13. A separate partial width NSD is provided to process the input data associated with each possible valid data width. In one exemplary embodiment, N=64 and the incoming data is naturally aligned on 16-bit boundaries. It is therefore possible for the set of parallel data at the beginning of the input data block to be offset by 16, 32 or 48 bits, relative to the 64-bit parallel data width of input 13. Given these offsets, valid data may be contained in 16, 32, or 48 bit subsets of the 64-bit parallel data width of input 13, or across the full width of the 64-bit parallel data input 13. The NSD portion includes (in addition to a full width NSD) three partial width NSDs, which respectively correspond to the aforementioned valid input, data widths of 16, 32 and 48 bits.

A monitor 25 includes suitable logic (e.g., state machine logic) for monitoring conventionally available control information 23 that indicates which part of the data input 13 (e.g., which part of a data bus) is currently valid. The monitor 25 outputs a selection control signal 26 to the selector 24. This selection control signal 26 causes the selector 24 to select the full width or partial width NSD that corresponds to the number of currently valid bits at the data input 13. The monitor 25 also outputs at 27 control signals that determine which K-bit and J-bit subsets of the N-bit input data width 13 are to be selected by the respective selectors A and B. For the aforementioned example wherein N=64 and the Incoming data is naturally aligned on 16-bit boundaries, if the initial set of parallel data within a data block received at 13 has a 48-bit offset, this means that 16 input bits are valid. Similarly, an initial 32-bit offset means that 32 input bits are valid, and an initial 16-bit offset means that 48 input bits are valid. If the initial set of parallel data has no offset, then the entire 64-bit input width contains valid data. Subsequently within the same data block, valid data could occur across the entire input data width at 13, and could also occur only across a subset (16, 32 or 48 bits wide) of the input data width, which subset aligns with the most significant portion of the input data width.

Once an incoming data block has been completely processed, using the full width NSD 14, and one or more partial width NSDs as may be necessary, the final syndrome in the feedback register 12 is available for checksum generator 16 to use in producing checksum 17.

Figure 3:
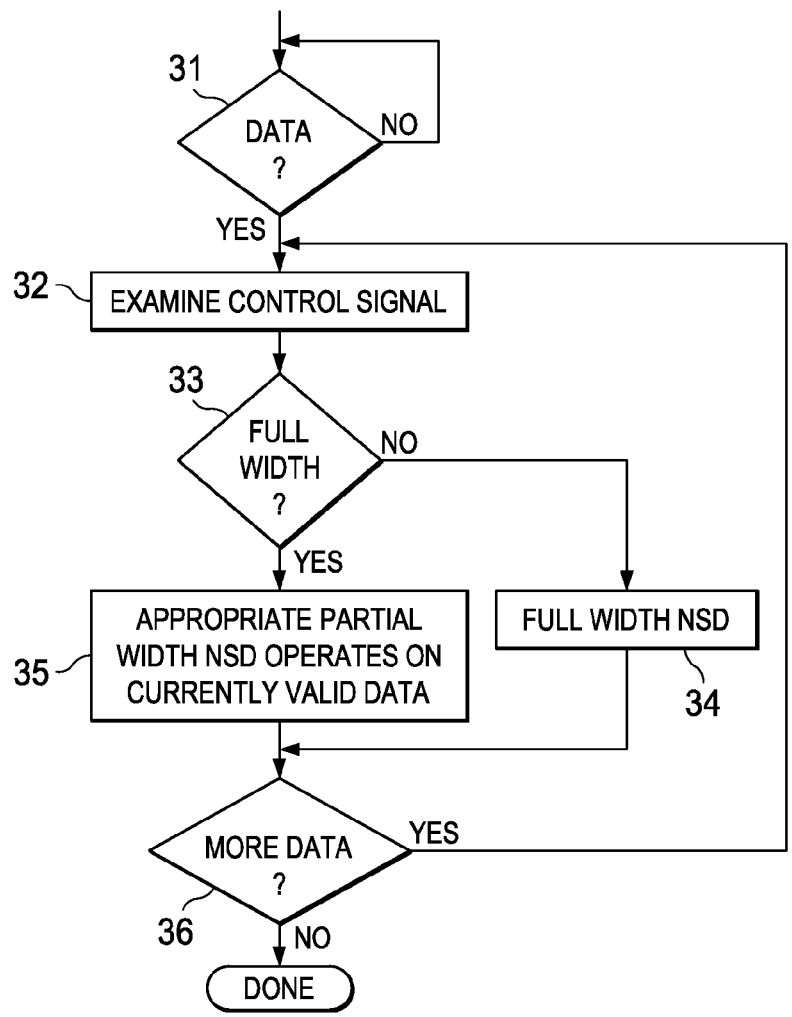
FIG. 3 illustrates operations that can be performed according to exemplary embodiments of the invention.

FIG. 3 illustrates operations that can be performed according to exemplary embodiments of the invention. In some embodiments, the CRC apparatus of FIG. 2 is capable of performing operations shown in FIG. 3. Once a block of incoming data arrives at 31, the control signal (e.g., 26 in FIG. 2) for valid data is examined at 32. If, at 33, the control signal indicates that the full width (all bits) of the data, input is currently valid, then a full width NSD operation is performed at 34. Otherwise, if the control signal indicates at 33 that less than the full width of the data input is currently valid, then the appropriate partial width NSD operation is performed on the currently valid data at 35. The operations at 32-35 can be repeated until the processing of the incoming data block is completed at 36.

Figure 4:
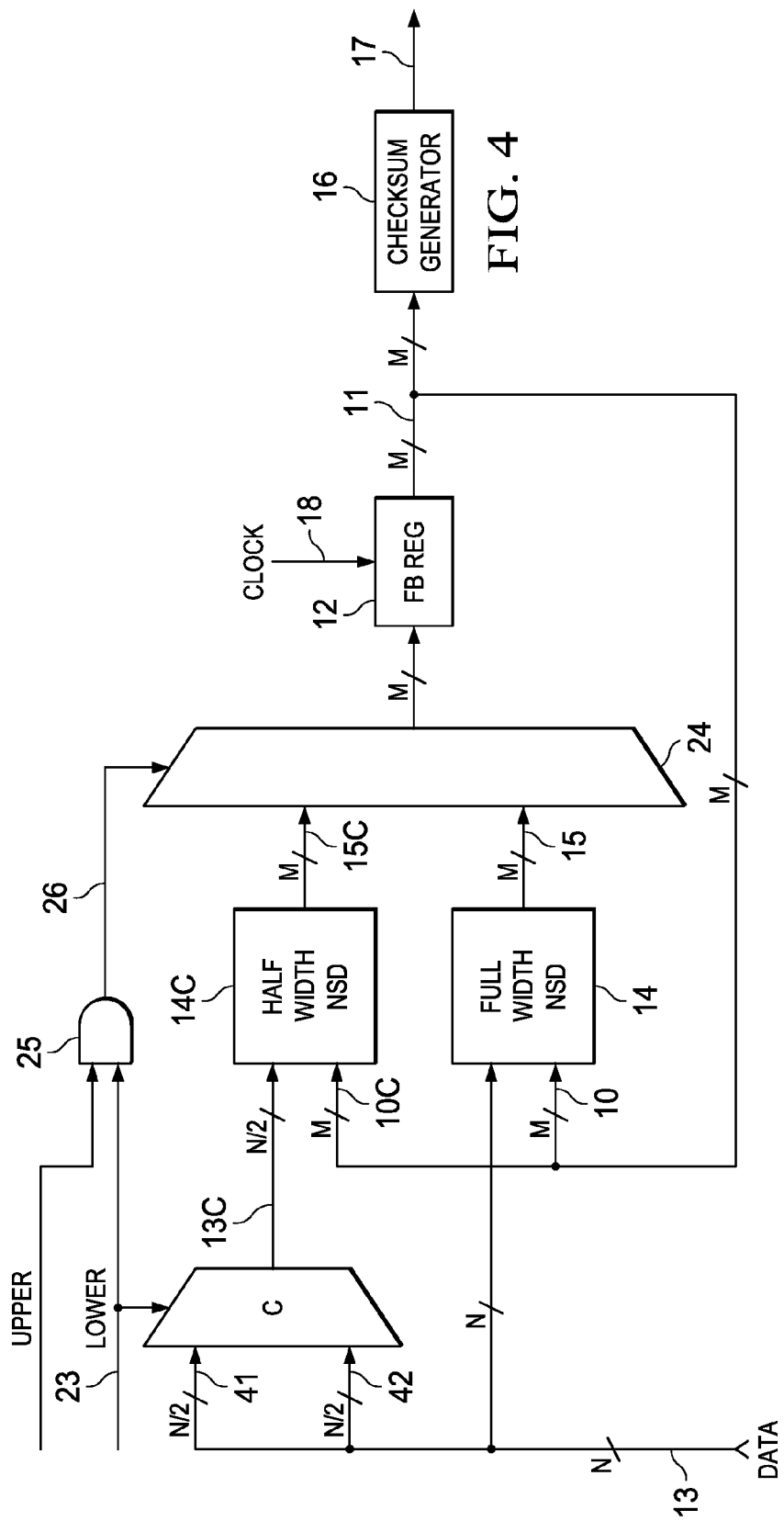
FIG. 4 diagrammatically illustrates the structure and operation of a CRC apparatus according to further exemplary embodiments of the invention.

FIG. 4 diagrammatically illustrates the structure and operation of a CRC apparatus according to further exemplary embodiments of the invention. In some embodiments, the CRC apparatus of FIG. 4 is capable of performing operations shown in FIG. 3 The apparatus shown in FIG. 4 is generally similar to that of FIG. 2, but illustrates an example of processing an input data block whose constituent data is naturally aligned on boundaries of one-half (N/2) the full parallel data width (N). This type of misalignment can result in an offset of N/2 bits. If the of feet occurs in the first-received set of data, then only the least significant N/2 bits at data input 13 will be valid. If the offset occurs in the last-received set of data, then only the most significant N/2 bits at data input 13 will be valid. The conventionally available control information at 23 indicates when the most significant (upper) N/2 bits are valid, and when the least significant (lower) N/2 bits are valid. When both the most significant N/2 bits and the least significant N/2 bits are valid, an AND gate monitor 25 activates the control signal 26, thereby causing the selector 24 to select the syndrome produced at 15 by the full width NSD 14. When only one or the other, but not both, of the most, significant N/2 bits and the least significant N/2 bits are valid, the control signal 26 causes the selector 24 to select the syndrome produced at 15C by a half width NSD 14C that is configured to produce the syndrome at 15C based on N/2 input bits received at its data input 13C. The syndrome selected by the selector 24 is fed back to the respective syndrome inputs 10 and 10C of the full and half width NSDs 14 and 14C. Whenever the least significant N/2 bits are valid, the "lower" control signal at 23 causes a selector C to select the least significant N/2 bits 42 of the data input 13, so the syndrome produced by the half width NSD 14C is based on the least significant N/2 bits at data input 13. Whenever the least significant N/2 bits are not valid, the "lower" control signal at 23 causes the selector 40 to select the most significant N/2 bits 41 of the data input 13, so the syndrome produced by the half width NSD 14C is based on the most significant N/2 bits at data input 13.

Although exemplary embodiments of the invention have been described above in detail, this does not limit the scope of the invention, which can be practiced in a variety of embodiments.

What is claimed is:

1. A cyclic redundancy check apparatus, comprising:
   a data input for receiving a sequence of sets of parallel data, each of said sets having a parallel data width that is at least as large as a first width and no larger than a second width that exceeds said first width; and
   a next state decoding portion coupled to said data input for producing a sequence of syndromes based on said received sequence of sets, said next state decoding portion configured to produce some of said syndromes based on respectively corresponding syndromes of said sets that have respective parallel data widths that are equal to said second width, and said next state decoding portion further configured to produce at least one of said syndromes based on a corresponding at least one of said sets that has a parallel data width that is less than said second width;
   wherein a last syndrome of said sequence of syndromes corresponds to all of said data in said sequence of sets.

2. The apparatus of claim 1, wherein said next state decoding portion includes a control input for receiving a control signal that indicates when said at least one syndrome is to be produced.

3. The apparatus of claim 2, wherein said next state decoding portion includes a first next state decoder configured to produce said some syndromes, and a second next state decoder configured to produce said at least one syndrome, each of said first and second next state decoders having a syndrome input and a syndrome output, and wherein said next state decoding portion includes a feedback path coupled to said syndrome outputs and said syndrome inputs.

4. The apparatus of claim 3, wherein said next state decoding portion includes a selector coupled to said control input and responsive to said control signal for coupling a selected one of said syndrome outputs to said feedback path.

5. The apparatus of claim 3, wherein said syndrome inputs are connected to one another.

6. The apparatus of claim 3, wherein said feedback path includes a register.

7. The apparatus of claim 3, wherein said parallel data width that is less than said second width is equal to said first width, wherein said next state decoding portion includes a third next state decoder for producing at least another of said syndromes based on a corresponding at least another of said sets that has a parallel data width that is between said first width and said second width, and wherein said third next state decoder has a syndrome input and a syndrome output that are coupled to said feedback path.

8. The apparatus of claim 7, wherein said second width is equal to a sum of said first width and said between width.

9. The apparatus of claim 1, including a monitor configured to monitor a control signal associated with said received sequence of sets, said next state decoding portion coupled to said monitor, said monitor and said next state decoding portion cooperable in response to said control signal for configuring said next state decoding portion to produce said at least one syndrome.

10. The apparatus of claim 9, wherein said next state decoding portion includes a first next state decoder configured to produce said some syndromes, a second next state decoder configured to produce said at least one syndrome, and a selector having an output, and having first and second inputs coupled to said data input, and wherein said second next state decoder has a data input coupled to said selector output.

11. The apparatus of claim 10, wherein said selector includes a control input that receives said control signal.

12. The apparatus of claim 11, wherein each of said first and second next state decoders has a syndrome input and a syndrome output, wherein said next state decoding portion includes a feedback path coupled to said syndrome outputs and said syndrome inputs, and wherein said next state decoding portion includes a further selector coupled to said monitor and cooperable therewith in response to said control signal for coupling a selected one of said syndrome outputs to said feedback path.

13. The apparatus of claim 9, wherein said next state decoding portion includes a first next state decoder configured to produce said some syndromes, and a second next state decoder configured to produce said at least one syndrome, each of said first and second next state decoders having a syndrome input and a syndrome output, wherein said next state decoding portion includes a feedback path coupled to said syndrome outputs and said syndrome inputs, and wherein said next state decoding portion includes a selector coupled to said monitor and cooperable therewith in response to said control signal for coupling a selected one of said syndrome outputs to said feedback path.

14. The apparatus of claim 9, wherein said monitor includes an AND gate having an input that receives said control signal, and having an output coupled to said next state decoding portion.

15. The apparatus of claim 1, wherein said first width is equal to one-half of said second width.

16. A cyclic redundancy check operations associated with a cyclic redundancy apparatus, comprising:
receiving a sequence of sets of parallel data, each of said sets having a parallel data width that is at least as large as a first width and no larger than a second width that exceeds said first width; and
producing a sequence of syndromes based on said received sequence of sets, including producing some of said syndromes based on respectively corresponding syndromes of said sets that have respective parallel data widths that are equal to said second width, and producing at least one of said syndromes based on a corresponding at least one of said sets that has a parallel data width that is less than said second width;
wherein a last syndrome of said sequence of syndromes corresponds to all of said data in said sequence of sets.

17. The operations of claim 16, wherein said parallel data width that is less than said second width is equal to said first width, and including producing at least another of said syndromes based on a corresponding one of said sets that has a parallel data width that is between said first width and said second width.

18. The operations of claim 17, wherein said second width is equal to a sum of said first width and said between width.

19. The operations of claim 16, wherein said first width is equal to one-half of said second width.

20. The operations of claim 16, including monitoring a control signal associated with said received sequence of sets to determine when to produce said at least one syndrome.

* * * * *